(12) United States Patent  (10) Patent No.: US 8,149,579 B2
Jadric et al.  (45) Date of Patent: Apr. 3, 2012

(54) COOLING MEMBER (75) Inventors: Ivan Jadric, York, PA (US); Stephen M. Hoover, York, PA (US); Kathleen S. Rogers, Dallastown, PA (US); Michael S. Todd, Jacobus, PA (US)

(73) Assignee: Johnson Controls Technology Company, Holland, MI (US)

( * ) Notice: Subject to any disclaimer, the term of this patent is extended or adjusted under 35 U.S.C. 154(b) by 1041 days.

(21) Appl. No.: 12/057,787

(22) Filed: Mar. 28, 2008

(65) Prior Publication Data

US 2009/0241575 A1  Oct. 1, 2009

(51) Int. Cl.
H05K 7/20 (2006.01)

(52) U.S. Cl. ....... 361/699; 257/714; 165/80.4; 361/702; 361/704; 361/715

(58) Field of Classification Search .......... 361/688–690, 361/692, 694–695, 697, 699, 702, 704, 707, 361/715
See application file for complete search history.

(56) References Cited

U.S. PATENT DOCUMENTS

| | | | |
|---|---|---|---|
| 3,593,103 A | 7/1971 | Chandler et al. | |
| 4,308,491 A | 12/1981 | Joyner, Jr. et al. | |
| 4,587,474 A | 5/1986 | Espelage et al. | |
| 4,628,991 A | 12/1986 | Hsiao et al. | |
| 4,758,771 A | 7/1988 | Saito et al. | |
| 5,005,640 A | 4/1991 | Grote et al. | |
| 5,081,368 A | 1/1992 | West | |
| 5,111,280 A * | 5/1992 | Iversen | 257/713 |
| 5,123,080 A | 6/1992 | Gillett et al. | |
| 5,127,085 A | 6/1992 | Becker et al. | |
| 5,199,487 A | 4/1993 | DiFrancesco et al. | |
| 5,203,401 A | 4/1993 | Hamburgen et al. | |
| 5,220,804 A * | 6/1993 | Tilton et al. | 62/64 |
| 5,293,070 A | 3/1994 | Burgess et al. | |
| 5,298,848 A | 3/1994 | Ueda et al. | |
| 5,316,075 A | 5/1994 | Quon et al. | |
| 5,317,805 A | 6/1994 | Hoopman et al. | |
| 5,410,230 A | 4/1995 | Bessler et al. | |
| 5,463,528 A | 10/1995 | Umezawa | |
| 5,539,617 A | 7/1996 | Bochtler | |

(Continued)

FOREIGN PATENT DOCUMENTS

DE  33 29 325 A  3/1984

(Continued)

OTHER PUBLICATIONS

Annabelle Van Zyl, Rene Spee, Alex Faveluke, and Shibashis Bhowmik; Voltange Sag Ride-Through for Adjustable-Speed Drives With Active Rectifiers; IEEE Transactions on Industry Applications; Nov./Dec. 1998; vol. 34, Issue No. 6.

(Continued)

*Primary Examiner* — Courtney Smith
(74) *Attorney, Agent, or Firm* — McNees Wallace & Nurick LLC (57) ABSTRACT

A cooling member for a variable speed drive. The variable speed drive has a component that generates heat during operation of the drive and a base. The base has a surface that receives the component, a channel formed in the surface of the base and a passageway formed in the base and receiving fluid therethrough. Fluid flowing through the passageway provides cooling to the component and the base is manufactured from an injection molding process.

20 Claims, 6 Drawing Sheets

U.S. PATENT DOCUMENTS

| | | | |
|---|---|---|---|
| 5,592,058 | A | 1/1997 | Archer et al. |
| 5,631,821 | A * | 5/1997 | Muso .................... 363/141 |
| 5,646,458 | A | 7/1997 | Bowyer et al. |
| 5,675,473 | A | 10/1997 | McDunn et al. |
| 5,747,955 | A | 5/1998 | Rotunda et al. |
| 5,796,234 | A | 8/1998 | Vrionis |
| 5,869,946 | A | 2/1999 | Carobolante |
| 5,936,855 | A | 8/1999 | Salmon |
| 5,969,966 | A | 10/1999 | Sawa et al. |
| 6,005,362 | A | 12/1999 | Enjeti et al. |
| 6,031,751 | A | 2/2000 | Janko |
| 6,034,872 | A | 3/2000 | Chrysler et al. |
| 6,072,302 | A | 6/2000 | Underwood et al. |
| 6,118,676 | A | 9/2000 | Divan et al. |
| 6,124,632 | A | 9/2000 | Lo et al. |
| 6,160,722 | A | 12/2000 | Thommes et al. |
| 6,166,937 | A | 12/2000 | Yamamura et al. |
| 6,213,195 | B1 * | 4/2001 | Downing et al. .......... 165/80.4 |
| 6,239,513 | B1 | 5/2001 | Dean et al. |
| 6,257,320 | B1 | 7/2001 | Wargo |
| 6,276,148 | B1 | 8/2001 | Shaw |
| 6,313,600 | B1 | 11/2001 | Hammond et al. |
| 6,348,775 | B1 | 2/2002 | Edelson et al. |
| 6,434,003 | B1 * | 8/2002 | Roy et al. ................. 361/699 |
| 6,457,542 | B1 | 10/2002 | Hosono et al. |
| 6,487,096 | B1 | 11/2002 | Gilbreth et al. |
| 6,559,562 | B1 | 5/2003 | Rostron |
| 6,686,718 | B2 | 2/2004 | Jadric et al. |
| 6,719,039 | B2 * | 4/2004 | Calaman et al. .......... 165/80.4 |
| 6,768,284 | B2 | 7/2004 | Lee et al. |
| 6,801,019 | B2 | 10/2004 | Haydock et al. |
| 6,867,970 | B2 | 3/2005 | Muller et al. |
| 6,961,244 | B2 | 11/2005 | Tsuchiya et al. |
| 7,025,607 | B1 | 4/2006 | Das et al. |
| 7,031,161 | B2 | 4/2006 | Miettinen et al. |
| 7,081,734 | B1 | 7/2006 | Jadric et al. |
| 7,173,823 | B1 * | 2/2007 | Rinehart et al. .......... 361/699 |
| 7,177,153 | B2 * | 2/2007 | Radosevich et al. ...... 361/699 |
| 7,210,304 | B2 * | 5/2007 | Nagashima ............... 62/259.2 |
| 7,212,406 | B2 | 5/2007 | Kaishian et al. |
| 7,289,329 | B2 | 10/2007 | Chen et al. |
| 7,301,772 | B2 * | 11/2007 | Tilton et al. ............... 361/699 |
| 7,511,942 | B2 | 3/2009 | Thrap |
| 7,522,403 | B1 | 4/2009 | Rinehart et al. |
| 2002/0186545 | A1 * | 12/2002 | Fukada et al. ............ 361/719 |
| 2003/0015873 | A1 | 1/2003 | Khalizadeh et al. |
| 2003/0052544 | A1 | 3/2003 | Yamamoto et al. |
| 2003/0133267 | A1 | 7/2003 | Beihoff et al. |
| 2005/0052848 | A1 | 3/2005 | Hamman |
| 2005/0057210 | A1 | 3/2005 | Ueda et al. |
| 2005/0068001 | A1 | 3/2005 | Skaug et al. |
| 2005/0162875 | A1 | 7/2005 | Rodriguez et al. |
| 2006/0209512 | A1 | 9/2006 | Taniguchi et al. |
| 2007/0063668 | A1 | 3/2007 | Schnetzka et al. |
| 2007/0177352 | A1 * | 8/2007 | Monfarad et al. ......... 361/699 |
| 2007/0230127 | A1 * | 10/2007 | Peugh et al. .............. 361/699 |
| 2007/0253164 | A1 | 11/2007 | Matsuo et al. |
| 2008/0310109 | A1 | 12/2008 | Park et al. |
| 2009/0141419 | A1 | 6/2009 | Pal et al. |

FOREIGN PATENT DOCUMENTS

| | | |
|---|---|---|
| DE | 37 44 353 C | 4/1989 |
| EP | 0272776 A2 | 6/1988 |
| EP | 0283954 A2 | 9/1988 |
| EP | 0313366 A2 | 4/1989 |
| EP | 0422221 A1 | 4/1991 |
| EP | 0603860 A | 6/1994 |
| EP | 0734198 A2 | 9/1996 |
| EP | 1300937 A2 | 4/2003 |
| EP | 1770774 A2 | 4/2007 |
| FR | 2 355 266 | 1/1978 |
| FR | 2715773 A1 | 8/1995 |
| JP | 60-037756 | 2/1985 |
| JP | 62-142021 | 6/1987 |
| JP | 4-026374 A | 1/1992 |
| JP | 5-068376 A | 3/1993 |
| JP | 5-327257 A | 12/1993 |
| JP | 5-335769 A | 12/1993 |
| JP | 6-105563 A | 4/1994 |
| JP | 7-335798 A | 12/1995 |
| JP | 8-167529 A | 6/1996 |
| JP | 11-346480 A | 12/1999 |
| JP | 2000-058746 A | 2/2000 |
| JP | 2000-323635 A | 11/2000 |
| JP | 2001-126948 A | 5/2001 |
| JP | 2002-176767 A | 6/2002 |
| WO | 93/14559 A1 | 7/1993 |
| WO | 97/32168 A1 | 9/1997 |

OTHER PUBLICATIONS

Annette Von Jouanne, Prasad N. Enjeti, and Basudeb Banerjee; Assessment of Ride-Through Alternatives for Adjustable-Speed Drives; IEEE Transactions on Industry Applications; Jul./Aug. 1999; vol. 35, Issue No. 4.

Johnson Controls, Inc., Variable Speed Drives Power Up, article, 2008, Johnson Controls, Inc., Milwaukee, WI, USA.

IBM Corp.; Water Impingement Test Cold Plate; IBM Technical Disclosure Bulletin; Nov. 1, 1991; vol. 34, No. 6, pp. 220-221.

* cited by examiner

COOLING MEMBER

CROSS REFERENCES TO RELATED APPLICATIONS

This patent application claims the benefit of U.S. patent application Ser. No. 11/932,479, filed Oct. 31, 2007, entitled COOLING SYSTEM FOR VARIABLE SPEED DRIVES AND INDUCTORS, for which priority is claimed and the disclosure of which is hereby incorporated by reference.

BACKGROUND

The present application relates generally to variable speed drives. The application relates more specifically to a liquid-cooled power semiconductor module in a variable speed drive.

Variable speed drives (VSDs) used for heating, ventilation, air-conditioning and refrigeration (HVAC&R) situations typically use metal, for example, copper, cooling members or cooling blocks for mounting and thermal management of insulated gate bipolar transistor (IGBT) semiconductor switches. The metal cooling blocks are expensive due to high material and labor costs associated with manufacturing such as machining. VSDs may also use plastic cooling blocks for cooling, which reduce materials costs, but plastic cooling blocks do not reduce labor costs, since the plastic cooling blocks also require machining. Plastic cooling blocks typically are not suitable for injection molding processes for manufacturing because of their large size and low annual usage quantities. The size of a particular cooling block is determined by the number of components, for example, modules, which are mounted to the cooling block. A cooling block may be mounted to two, to as many as six or more modules. Each module mounted to the cooling block requires multiple channels to be machined into the cooling blocks, forming a tub. Thus, a single cooling block may have six or more tubs, depending on the number of modules mounted thereto. Due to the physical size of the cooling block, the process of injection molding to form the cooling blocks is rendered impractical. Also, VSDs covering applications ranging from low horsepower to high horsepower require cooling blocks with two to six tubs. In such applications, low quantities of each individual size are used, thereby causing large costs for injection molding each individual sized cooling block.

SUMMARY

One embodiment of the present invention relates to a variable speed drive with a component that generates heat during operation of the drive and a base with a surface for receiving the component. The base also has a tub formed in the surface of the base and a passageway formed in the base and configured to receive fluid therethrough. A portion of the fluid flowing through the passageway is diverted to the tub and the fluid provides cooling to the component. The base is manufactured from an injection molding process.

Another embodiment of the present invention relates to a variable speed drive with a base with a surface for receiving a component. The base also has a tub formed in the surface of the base and a passageway formed in the base and configured to receive fluid therethrough. A portion of the fluid flowing through the passageway is diverted to the tub and the fluid provides cooling to the component. The base is manufactured from an injection molding process.

Yet another embodiment of the present invention relates to a variable speed drive having at least two components that generate heat during operation of the drive and at least two bases having a surface configured to receive the at least two components. Each base has a tub formed in the surface of the base and a passageway formed in the base for receiving fluid therethrough. A portion of the fluid flowing through the passageway is diverted to the tub and the fluid provides cooling to a component. The at least two bases are manufactured from an injection molding process and the at least two bases are connected to form a continuous passageway therethrough.

DETAILED DESCRIPTION OF THE EXEMPLARY EMBODIMENTS

Figure 1:
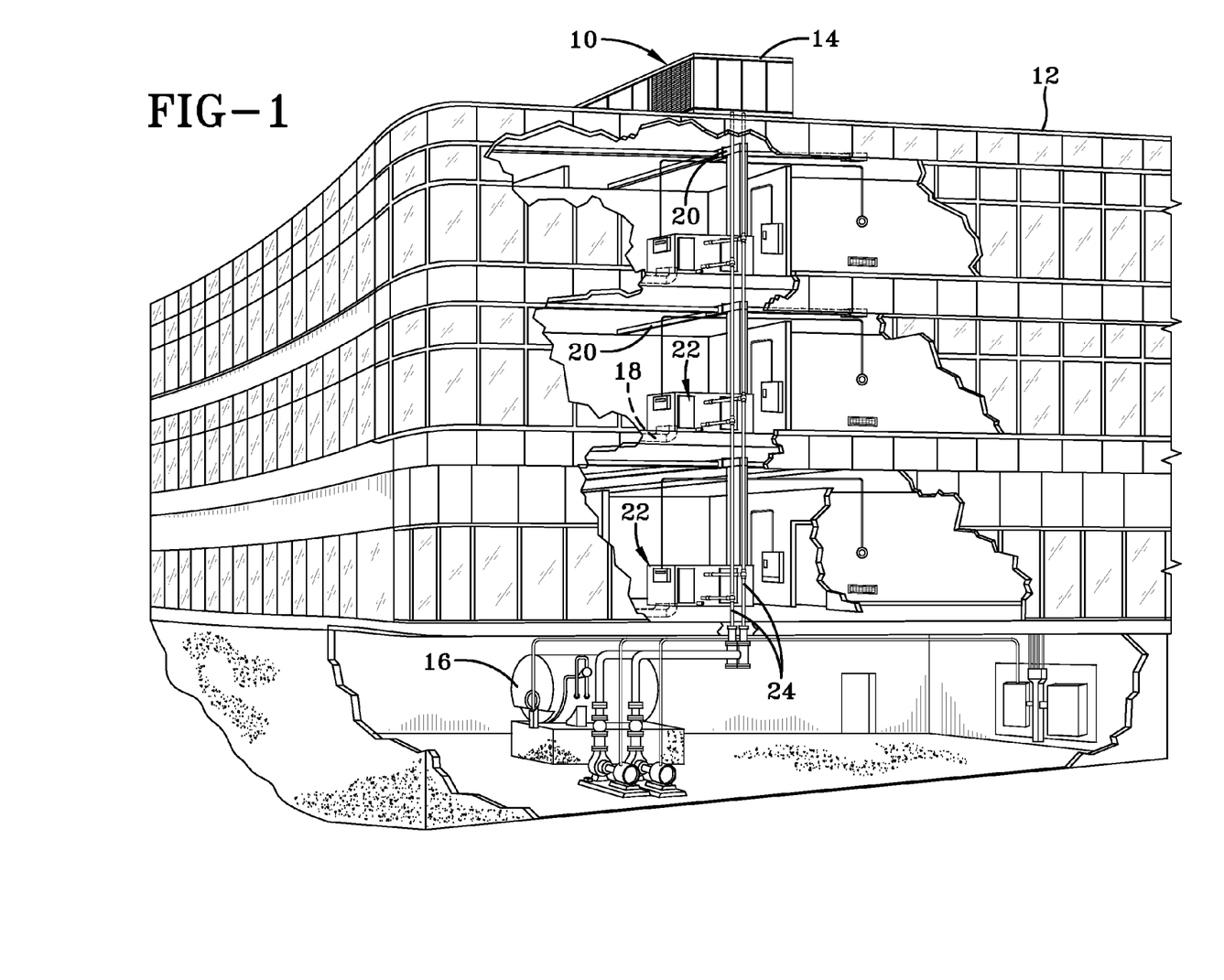
FIG. 1 shows an exemplary embodiment of a Heating, Ventilation, Air Conditioning and Refrigeration (HVAC&R) in a commercial environment.

FIG. 1 shows an exemplary environment for a Heating, Ventilating, Air Conditioning system (HVAC system) 10 in a building 12 for a typical commercial setting. System 10 may include compressor incorporated into a chiller 14 that can supply a chilled liquid that may be used to cool building 12. System 10 can also include a boiler 16 to supply a heated liquid that may be used to heat building 12, and an air distribution system that circulates air through building 12. The air distribution system can include an air return duct 18, an air supply duct 20 and an air handler 22. Air handler 22 can include a heat exchanger that is connected to boiler 16 and chiller 14 by conduits 24. The heat exchanger in air handler 22 may receive either heated liquid from boiler 16 or chilled liquid from chiller 14 depending on the mode of operation of system 10. System 10 is shown with a separate air handler on each floor of building 12, but it will be appreciated that these components may be shared between or among floors.

Figure 2:
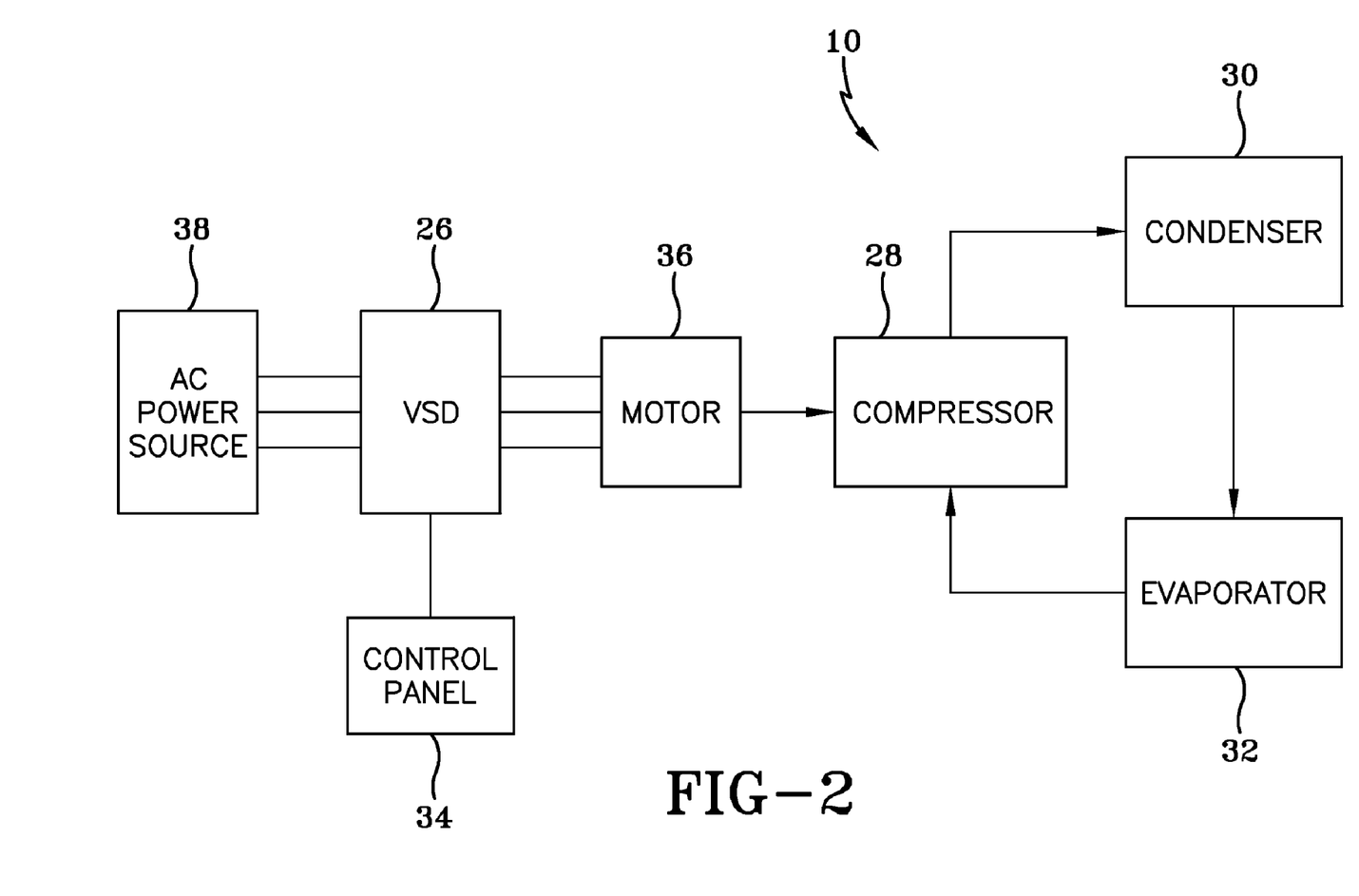
FIG. 2 schematically illustrates an exemplary embodiment of a HVAC&R System that may be used in the exemplary embodiment of FIG. 1.

FIG. 2 schematically illustrates an exemplary embodiment of system 10 with VSD 26 that may be used in building 12 in FIG. 1. System 10 may include compressor 28, a condenser 30, a liquid chiller or evaporator 32 and a control panel 34. Compressor 28 is driven by motor 36 that is powered by VSD 26. VSD 26 receives AC power having a particular fixed line voltage and fixed line frequency from AC power source 38 and provides AC power to motor 36 at desired voltages and desired frequencies, both of which can be varied to satisfy particular requirements. Control panel 34 can include a variety of different components such as an analog to digital (A/D) converter, a microprocessor, a non-volatile memory, and an interface board, to control operation of system 10. Control panel 34 can also be used to control the operation of VSD 26, and motor 36.

Compressor 28 compresses a refrigerant vapor and delivers the vapor to condenser 30 through a discharge line. Compressor 28 can be any suitable type of compressor, for example, a screw compressor, a centrifugal compressor, a reciprocating compressor, a scroll compressor, etc. The refrigerant vapor delivered by compressor 28 to condenser 30 enters into a heat exchange relationship with a fluid, for example, air or water, and undergoes a phase change to a refrigerant liquid as a result of the heat exchange relationship with the fluid. The condensed liquid refrigerant from condenser 30 flows through an expansion device (not shown) to evaporator 32.

Evaporator 32 may include connections for a supply line and a return line of a cooling load. A secondary liquid, for example, water, ethylene, calcium chloride brine or sodium chloride brine, travels into evaporator 32 via return line and exits evaporator 32 via supply line. The liquid refrigerant in evaporator 32 enters into a heat exchange relationship with the secondary liquid to lower the temperature of the secondary liquid. The refrigerant liquid in evaporator 32 undergoes a phase change to a refrigerant vapor as a result of the heat exchange relationship with the secondary liquid. The vapor refrigerant in evaporator 32 exits evaporator 32 and returns to compressor 28 by a suction line to complete the cycle. It is to be understood that any suitable configuration of condenser 30 and evaporator 32 can be used in system 10, provided that the appropriate phase change of the refrigerant in the condenser 30 and evaporator 32 is obtained.

System 10 may include many other features that are not shown in FIG. 2. These features have been purposely omitted to simplify the drawing for ease of illustration. System 10 can have multiple compressors, powered by a single VSD as shown in FIG. 2 or multiple VSDs connected into each of one or more refrigerant circuits.

Figure 3:
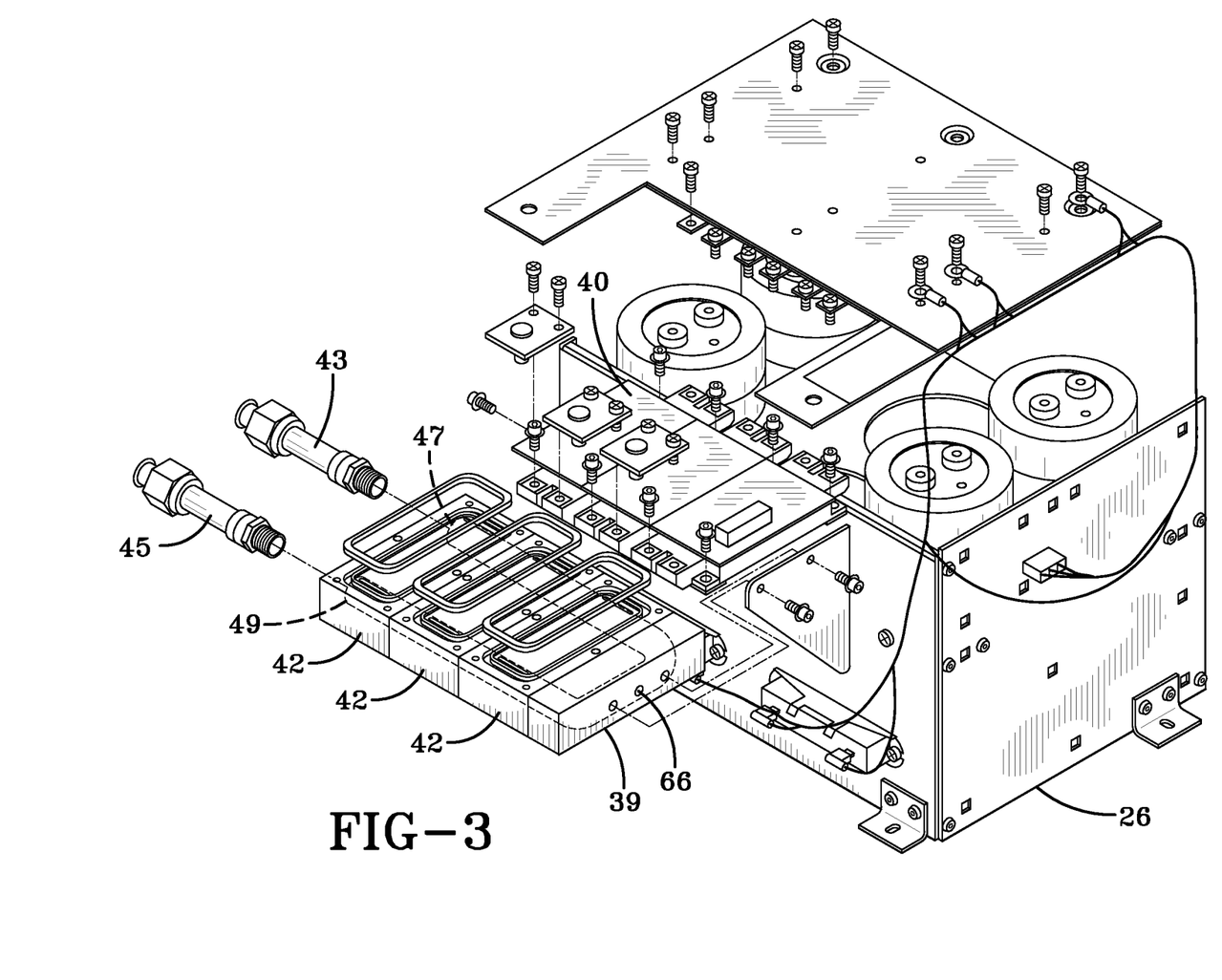
FIG. 3 shows an exemplary embodiment in an exploded view one part of a variable speed drive system with a cooling member.

FIG. 3 shows one part of a variable speed induction motor drive 26 with a plurality of switches 40 that are placed over cooling member 42. VSD 26 may be used to provide desired power to motors or compressors for different applications or HVAC systems. For example, such a motor may drive a compressor of a chiller system. Switches 40 of the VSD 26 are depicted as an Infineon module containing 3 dual IGBT's, but other semiconductor devices or other electronic components that require cooling for optimal operation could be cooled with this member 42. Cooling fluid pipes 43, 45 are connected to inlet passageway 47 and outlet passageway 49, respectively to introduce cooling fluid into member 42. Pipes 43 and 45 are connected to a cooling system, which provides a continuous flow of cooling fluid to member 42. A cooling fluid such as condenser water, is applied to pipe 43, flows through the member 42, as described below, and flows out through pipe 45. An endplate 39 may be secured to the last cooling member 42 to direct the flow of fluid from pipe 43 to pipe 45.

A variety of different cooling fluids, including water and known refrigerants can be introduced to cooling members 42 and used to cool the electronic components. In addition, a variety of different cooling system, such as known heat exchangers, can be used to cool the cooling fluid that is applied to and exits from cooling members 42.

Cooling member 42 cools modules used to power a motor or compressor of an HVAC system. The modules are fixed to the cooling member 42 in a sealed relationship. The cooling fluid applied to cooling member 42 is preferably water that flows through cooling member 42 and a heat exchanger in a closed loop. The heat exchanger cools the water before it is reintroduced to cooling member 42. Preferably, the heat exchanger is a shell and tube type heat exchanger where water from a cooling tower of the HVAC system is used to cool the water applied to cooling member 42.

Figure 4:
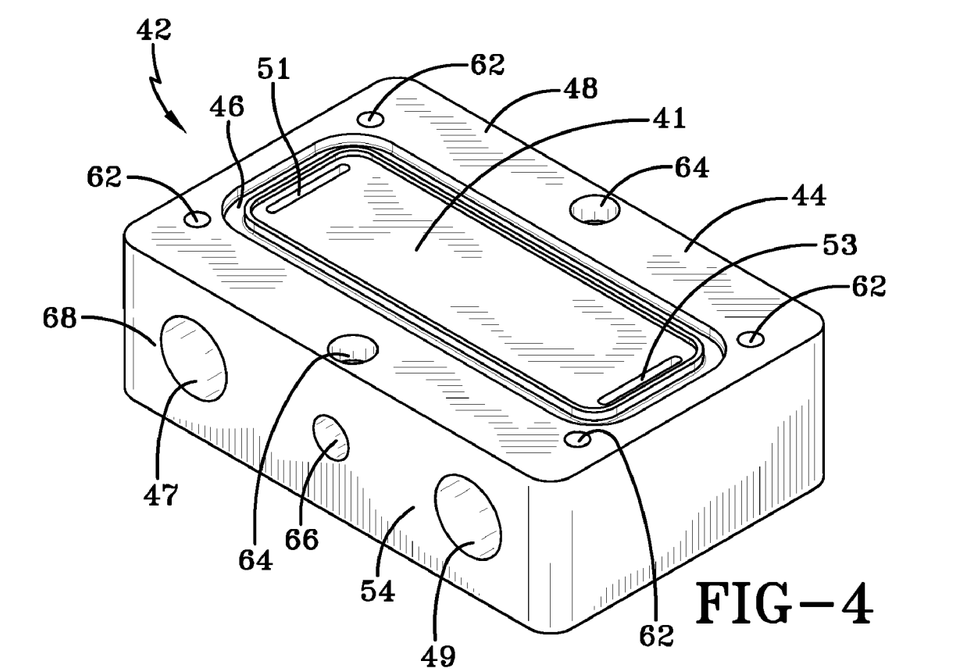
FIG. 4 shows a top perspective view of an embodiment of a cooling member in accordance with aspects of the application.
Figure 5:
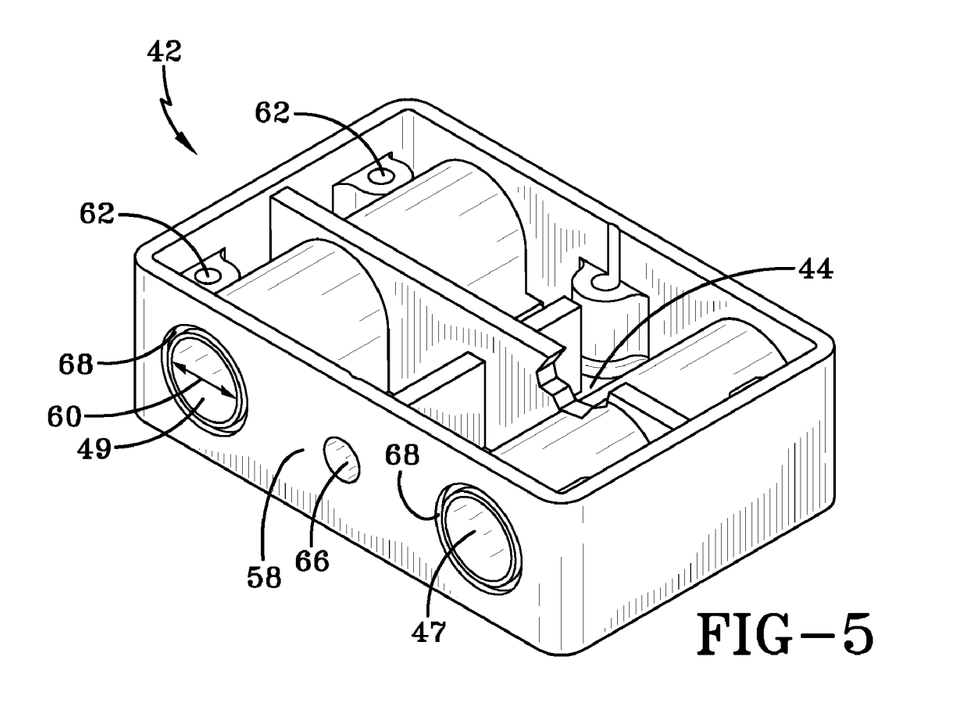
FIG. 5 shows a bottom perspective view of an embodiment of a cooling member in accordance with aspects of the application.

In one embodiment, shown in FIGS. 4 and 5, cooling member 42 includes a plastic base 44 having a channel 46 formed on the top surface 48. In alternate embodiments, member 42 may be composed of other materials such as non-metallic materials. A component (not shown), for example, a semiconductor module, is mounted on top surface 48. Channel 46 formed on top surface 48 provides a space for an o-ring (not shown) to seal against a base plate of the component. Base 44 has an inlet passageway 47 that extends through base 44 and an outlet passageway 49 that extends through base 44. Passageways 47 and 49 have predetermined diameters, or cross sectional area for alternate profiles, 60 that are sized to satisfy the flow rate and pressure drop requirements when multiple cooling members 42 are used together. For example, in one exemplary application of a 1300 hp VSD design, six cooling members are used together. It is to be understood that passageways 47 and 49 are not limited to a circular profile. A cooling liquid, for example, condenser water, is circulated through passageways 47 and 49 to provide cooling to the component.

Base 44 has a tub 41 formed in top surface 48 for providing cooling to a component (not shown). A portion of cooling fluid flowing through inlet passageway 47 is diverted through a tub inlet 51, across tub 41, and discharged through a tub outlet 53. The cooling fluid then flows through outlet passageway 49. Cooling fluid flowing across tub 4 land has direct contact with a component (not shown). The cooling fluid exchanges heat with the component to cool the component.

Base 44 has at least one mounting aperture 62 for mounting a component (not shown) to base 44. In addition, base 44 may have at least one VSD mounting aperture 64 for mounting base 44 to an assembly (not shown) of VSD 26. A fastener (not shown), for example, a screw, may be used to secure base 44 to the component (not shown) and VSD 26. Other types of fasteners may be used. Base 44 also has through hole 66, intended for a throughbolt or other suitable fastener to secure and hold together multiple bases 44 for multiple components. When the throughbolt secures multiple bases 44 together, the o-rings or other suitable sealing devices are compressed in grooves 68, which creates a seal between adjacent bases 44.

Figure 6:
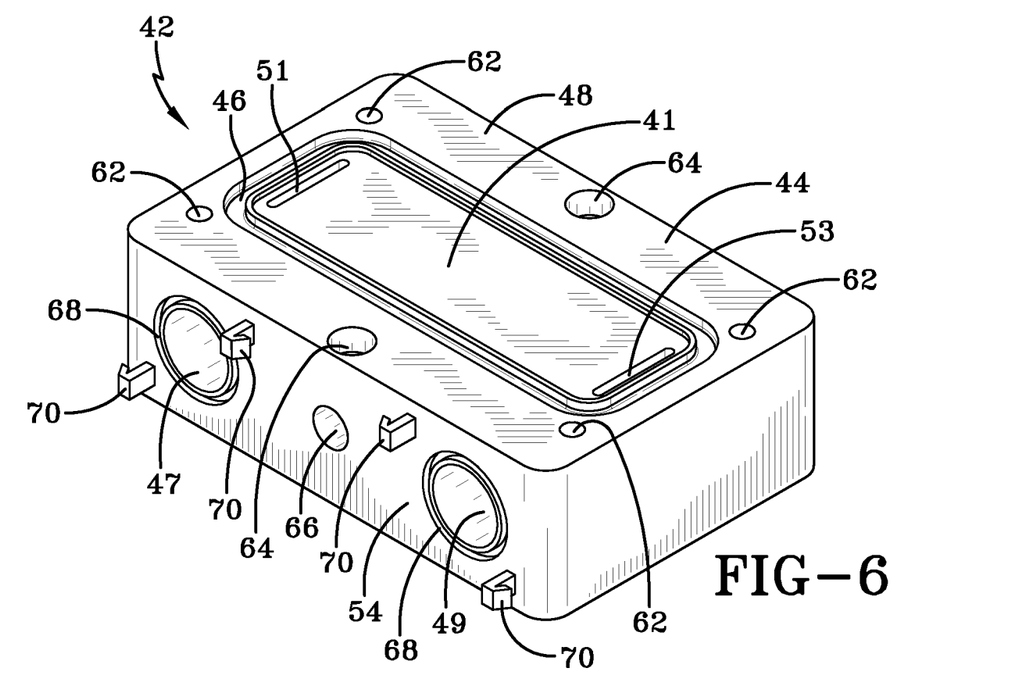
FIG. 6 shows a top view of an embodiment of a cooling member in accordance with aspects of the application.
Figure 7:
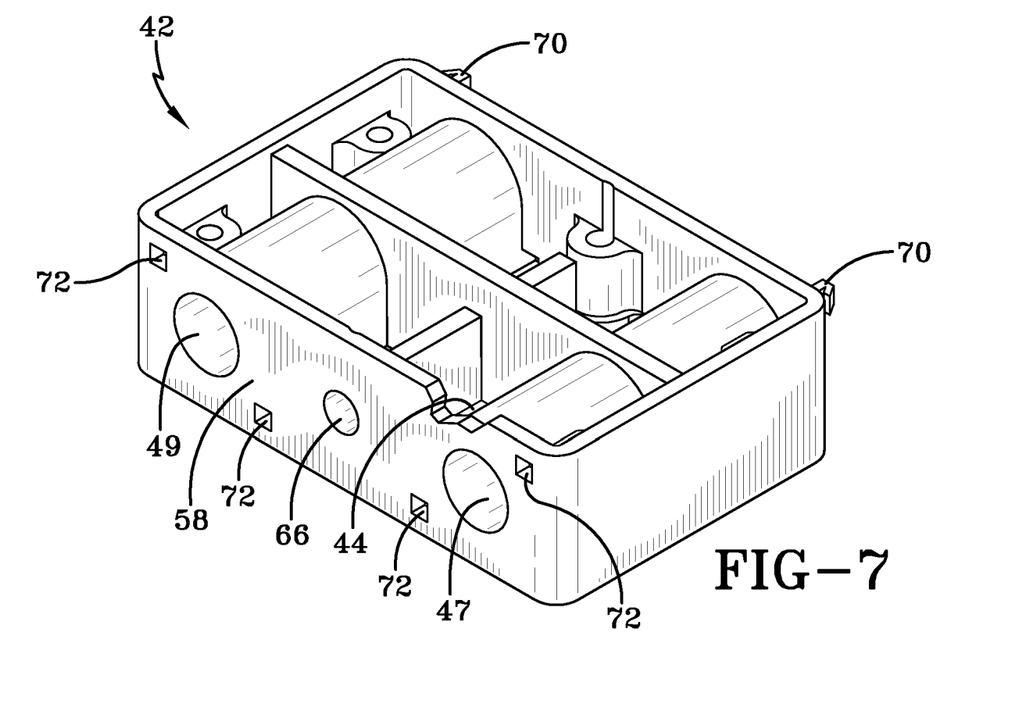
FIG. 7 shows a bottom view of an embodiment of a cooling member in accordance with aspects of the application.

FIGS. 6 and 7 illustrate another embodiment of base 44. Base 44 may have mating features, for example, fastener tabs 70 and fastener receptacles 72. When multiple bases are fastened together, fastener tabs 70 from one base may mate with fastener receptacles 72 on an adjacent base, providing a snap-in mechanism for securing the bases together. Such snap-in mechanism also provides adequate pressure on o-rings used to seal between adjacent bases. Cooling member 42 may be manufactured by an injection molding process or other suitable cost-effective process or method.

Figure 8:
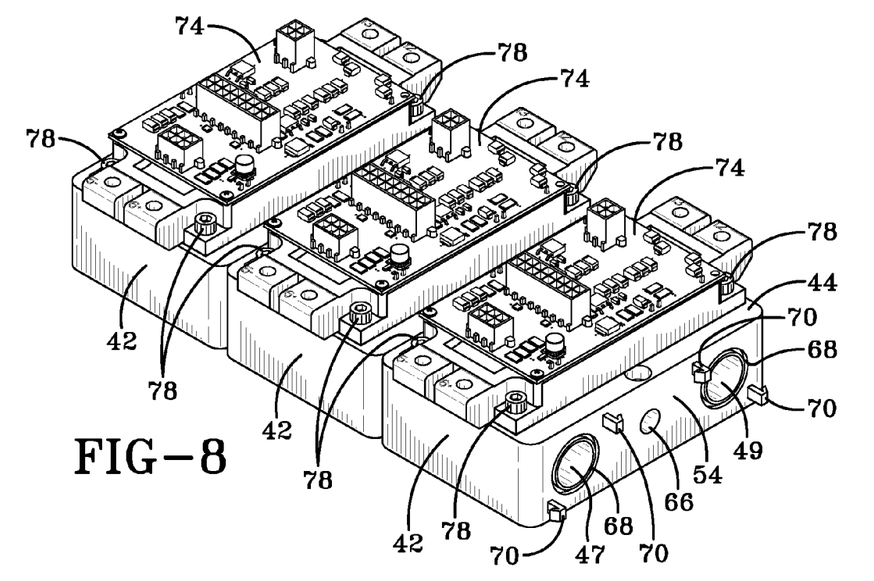
FIG. 8 shows a plurality of cooling members interconnected in accordance with aspects of the application.
Figure 9:
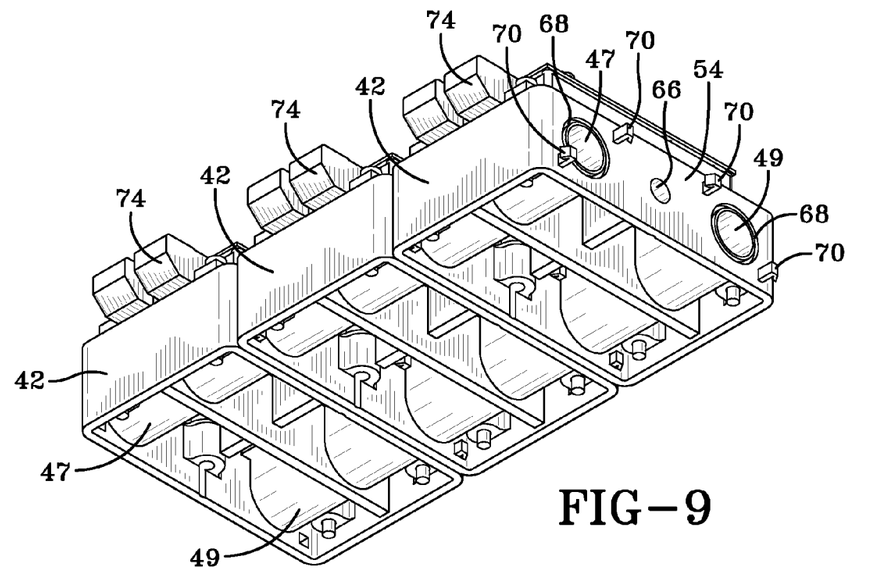
FIG. 9 shows a bottom view of a plurality of cooling members interconnected in accordance with aspects of the application.

FIGS. 8 and 9 illustrate a plurality of cooling members 42 interconnected with components 74 mounted on cooling members 42 for cooling. When a VSD (not shown) has more than one component 74, each component 74 is mounted to a corresponding surface of a base 44. As shown, component 74 is semiconductor module with a circuit board. For example, if the VSD has four components 74, each component 74 is mounted to a separate base 44 and each base 44 is secured to the adjacent bases. Base 44 may have a through-hole 66 disposed and extending axially through the base 44 from side surface 54 to the opposite side surface. At least one fastener (not shown), for example, a screw, may be secured in through-hole 66 and into the through-hole of the next base 44, thereby securing the multiple bases to one another. When multiple bases are secured together, the passageways 47, 49 of each base 44 are in fluid communication with each other, forming one large passageway that extends through all of the bases. Inlet 47 and outlet 49 may have a groove 68 to accept an o-ring (not shown) or other suitable sealant or sealer. When multiple bases are fastened together, the o-ring is compressed between the bases to seal the passageways and prevent leaks. A plurality of fasteners 78 may secure component 74 to cooling member 42.

While only certain features and embodiments of the invention have been illustrated and described, many modifications and changes may occur to those skilled in the art (For example, variations in sizes, dimensions, structures, shapes and proportions of the various elements, values of parameters (For example, temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (For example, those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A cooling member for a component of a variable speed drive comprising:
 a base, the base comprising a surface configured and positioned to receive the component;
 a tub positioned in the surface of the base;
 a first passageway extending through the base and in fluid communication with the tub;
 a second passageway extending through the base and in fluid communication with the tub, the second passageway being positioned opposite the first passageway;
 a connecting device formed in the base to connect the base to at least one additional base; and
 wherein the first passageway, second passageway and tub are used to circulate a fluid to provide cooling to the component and wherein the base is manufactured from an injection molding process.

2. The cooling member of claim 1, comprising a channel positioned in the surface of the base and surrounding the tub, the channel configured to receive a seal to prevent leaking of fluid.

3. The cooling member of claim 1, wherein the first passageway is an inlet passageway and the second passageway is an outlet passageway and wherein fluid enters the base through the inlet passageway and exits the base through the outlet passageway.

4. The cooling member of claim 3, wherein the tub comprises a tub inlet and a tub outlet, wherein a portion of the fluid in the inlet passageway enters the tub inlet, flows across the tub and exits the tub through the tub outlet to the outlet passageway.

5. The cooling member of claim 1, wherein the base is configured for mounting a semiconductor module.

6. The cooling member of claim 1, wherein the base is a non-metal material.

7. A variable speed drive comprising:
 at least two components that generate heat during operation;
 a cooling member configured to circulate a fluid to cool the at least two components, the cooling member comprising:
  at least two interconnected bases, each base having a surface configured and positioned to receive a corresponding component of the at least two components;
  a tub positioned in the surface of each base of the at least two interconnected bases;
  a first passageway extending through each base of the at least two interconnected bases and in fluid communication with the corresponding tub in the base;
  a second passageway extending through each base of the at least two interconnected bases and in fluid communication with the corresponding tub in the base, the second passageway being positioned opposite the first passageway;
  at least one connecting device to connect the at least two bases; and
 wherein the first passageway, second passageway and each tub are used to circulate a fluid to provide cooling to the corresponding component, and the at least two interconnected bases are manufactured from an injection molding process.

8. The variable speed drive of claim 7, comprising a channel positioned in the surface of each base and surrounding the corresponding tub, the channel configured to receive a seal to prevent leaking of fluid.

9. The variable speed drive of claim 7, wherein the first passageway is an inlet passageway and the second passageway is an outlet passageway and fluid enters each base through the inlet passageway and exits each base through the outlet passageway.

10. The variable speed drive of claim 7, wherein the tub comprises a tub inlet and a tub outlet, wherein a portion of the fluid in the inlet passageway enters the tub inlet and flows across the tub and exits the tub through the tub outlet to the outlet passageway.

11. The variable speed drive of claim 7, wherein the cross sectional area of the first passageway is sized to satisfy the predetermined fluid flow and fluid pressure drop requirements.

12. The variable speed drive of claim 7, wherein each base of the at least two interconnected bases is a non-metal material.

13. The variable speed drive of claim 7, wherein the at least one connecting device comprises a through-hole on opposite sides of each base for receiving a fastener and wherein the fastener provides a secure connection between the at least two bases.

14. The variable speed drive of claim 7, wherein the at least one connecting device comprises a fastener tab and a fastener receptacle on opposite sides of each base, the fastener receptacle configured to receive a fastener tab of a neighboring base, and wherein when a fastener tab is secured in a fastener receptacle, a secure connection is made with the neighboring base.

15. The variable speed drive of claim 7, wherein the cooling member comprises an end plate connected to a base of the at least two interconnected bases by the connecting device, the end plate being configured and positioned to direct fluid from the first passageway to the second passageway.

16. The cooling member of claim 1, wherein the connecting device comprises a projection and a corresponding aperture to receive the projection, the projection and aperture being positioned on opposite sides of the base near the first and second passageways.

17. The cooling member of claim 16, wherein the projection comprises a snap-in mechanism.

18. The cooling member of claim 1, comprising an aperture in the surface of the base to mount the component to the base.

19. The cooling member of claim 1, comprising an end plate connected to the base by the connecting device, the end plate being configured and positioned to direct fluid from the first passageway to the second passageway.

20. The cooling member of claim 1, wherein the connecting device comprises a pair of holes positioned on opposite sides of the base near the first and second passageways, each hole of the pair of holes being configured to receive a fastener.

* * * * *

UNITED STATES PATENT AND TRADEMARK OFFICE
CERTIFICATE OF CORRECTION

PATENT NO.         : 8,149,579 B2                                                     Page 1 of 1
APPLICATION NO.    : 12/057787
DATED              : April 3, 2012
INVENTOR(S)        : Ivan Jadric et al.

It is certified that error appears in the above-identified patent and that said Letters Patent is hereby corrected as shown below:

Column 4, line 31, "tub 4 land" should read --tub 41 and--

Signed and Sealed this
Sixteenth Day of October, 2012

David J. Kappos
*Director of the United States Patent and Trademark Office*